(12) United States Patent
Lu

(10) Patent No.: US 6,577,911 B2
(45) Date of Patent: Jun. 10, 2003

(54) SYSTEM AND METHOD FOR CONTROLLING SURFACE MOUNTING PROCESS

(75) Inventor: Po-Wen Lu, Taipei (TW)

(73) Assignee: Inventec Corporation, Taipai (TW)

(*) Notice: Subject to any disclaimer, the term of this patent is extended or adjusted under 35 U.S.C. 154(b) by 0 days.

(21) Appl. No.: 09/975,191

(22) Filed: Oct. 12, 2001

(65) Prior Publication Data

US 2003/0074094 A1 Apr. 17, 2003

(51) Int. Cl.[7] ............................................. G06F 19/00
(52) U.S. Cl. ......................... 700/96; 700/110; 700/116
(58) Field of Search ................... 29/592, 829; 361/748, 361/751; 705/60, 62; 700/95, 116, 96, 110

(56) References Cited

U.S. PATENT DOCUMENTS 5,325,582 A * 7/1994 Glaser et al. ............... 700/116
5,442,545 A * 8/1995 Matsui et al. ............... 700/110
5,579,231 A * 11/1996 Sudou et al. ................ 700/95

* cited by examiner

Primary Examiner—Leo Picard
Assistant Examiner—Walter Russell Swindell
(74) Attorney, Agent, or Firm—Rothwell, Figg, Ernst & Manbeck P.C.

(57) ABSTRACT

A system and a method for controlling a surface mounting process are proposed. Barcodes of feeder trays in a work station are scanned, prompting an inquiry module to retrieve a corresponding work station serial number, which is transmitted to a microprocessor module. This then prompts the microprocessor module to generate a signal to the work station, so as to inform an operator to place the scanned feeder trays in the work station. After placing the feeder trays in position, the microprocessor module generates another signal to inform the operator whether or not the surface mounting process is readily initiated. A printer device is prompted by the microprocessor module to print a list of material serial numbers of the feeder trays to be replenished, allowing the operator to perform replenishment for the feeder trays according to the list, so as to maintain the progress of the surface mounting process.

20 Claims, 5 Drawing Sheets

SYSTEM AND METHOD FOR CONTROLLING SURFACE MOUNTING PROCESS

FIELD OF THE INVENTION

The present invention relates to systems and methods for controlling surface mounting processes, and more particularly, to a system and method for controlling placement and replenishment of feeder trays of a surface mounting device (SMD) accurately.

BACKGROUND OF THE INVENTION

Generally, during surface mounting of electronic components onto a circuit board, a position recognition of the circuit board by detecting the image of the recognition mark using a camera is carried out to mount electronic components onto the circuit board in a work station. And then, the surface mounting action is carried out by a mounting machine in which the mounting head picks up a specified electronic component from a feeder tray and mounts the electronic component onto the circuit board at a predetermined position, and this action is repeated until all of the electronic components are mounted onto the circuit board. The SMD mounting head moves upwardly and downwardly, and horizontally between the positions during the mounting action. The feeder tray system supplying the electronic components to the SMD mounting head comprises a plurality of feeder trays, wherein each tray carries one particular type of electronic components. The plurality of trays moves along a rack system automatically to supply the electronic components to the mounting head during the surface mounting process.

Figure 1:
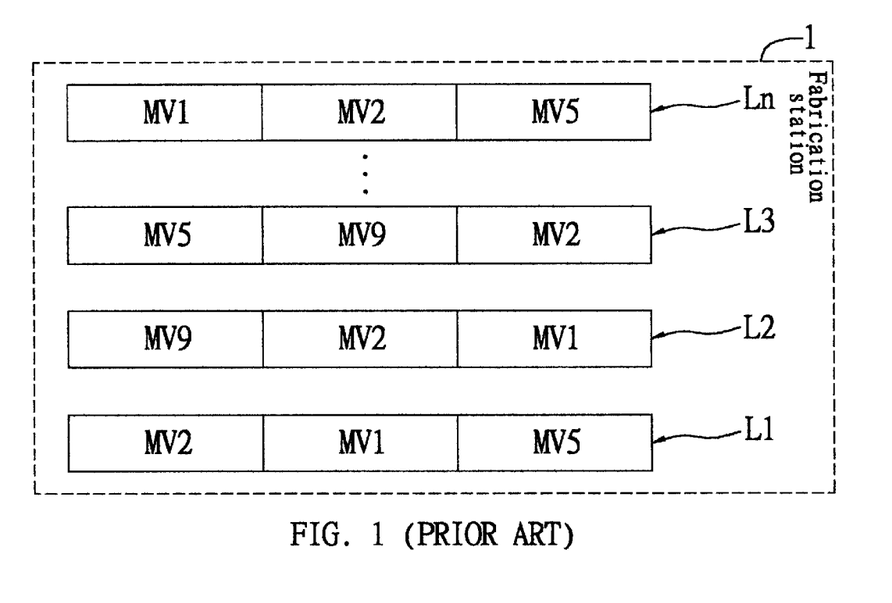
FIG. 1 (PRIOR ART) is a schematic diagram showing a conventional SMD fabrication station.

FIG. 1 illustrates a SMD fabrication station 1, comprising multiple fabrication lines (L1, L2, L3, . . . , Ln). Each of the fabrication lines consists of a plurality of surface mounting devices (MV1, MV2, MV5, . . . etc), and each of the machine platforms includes a plurality of work stations (not shown). Each of the work stations may be numbered, for example: 001, 002, 003, 004, . . . etc. In a fabrication start up, for example, an operator prepares to load electronic components corresponding to an identification number LIMV9002 for a feeder tray 1234. Next, the feeder tray 1234 is placed into a mounting rack (not shown), and then secured in a work station 002 of a SMD MV9 in a fabrication line L1. Likewise after all of the feeder trays are loaded with corresponding types of electronic components and secured in position in the fabrication line, the mounting operation is initiated.

However, there are several disadvantages in the above procedure. Since loading of electronic components into each feeder tray is carried out manually and since a considerable number of different types of electronic components need to be mounted onto a board e.g. printed circuit board (PCB), there is a high possibility of loading electronic components into a wrong feeder tray. It is highly critical that loading of wrong electronic components would result in mounting of the wrong electronic components at wrong positions on the board. As a result, the mounting procedure needs to be re-performed, which in turn leads to waste of materials and fabrication time, thereby making the fabrication cost-ineffective to implement with poor yield.

Further, there is a potential possibility for not replacing or replenishing the feeder tray that runs out of electronic components in real time due to carelessness of the operation, and this therefore increases the operation time of the mounting procedure.

Therefore, there is need to improve operation of SMD effectively to increase yield and productivity at the same time.

SUMMARY OF THE INVENTION

A primary objective of the present invention is to provide a new system and method for controlling a surface mounting process, so as to allow the surface mounting process to be conducted in greater accuracy.

Another objective of the invention is to provide a system and method for controlling a surface mounting process, so as to improve productivity and increase profit.

In accordance with the above and other objective, the present invention proposes a system and method for controlling a surface mounting process. The system for controlling a surface mounting process of the invention is applied to a surface mounting device (SMD) fabrication station, wherein an operator is informed of a work station status of the SMD fabrication station, and a feeder tray in the work station is assigned and pasted with a barcode reflecting identification data for the feeder tray, so as to allow the operator to perform a surface mounting process in the SMD fabrication station.

The system for controlling a surface mounting process comprises: a scanning device for scanning the barcode on the feeder tray; a database server having a database for storing a plurality of the barcodes and a SMD correlation chart, wherein each of the barcodes includes data of the feeder tray relating to a material serial number, a loading capacity and a quantity of the feeder tray of this type, and corresponds to a work station serial number in the SMD correlation chart; an inquiry module for retrieving a work station serial number from the SMD correlation chart corresponding to the scanned barcode from the scanning device; a microprocessor module for receiving the retrieved work station serial number from the inquiry module, so as to generate a stream controlling signal in response to the received work station serial number, and for generating an operational or non-operational signal or a replenishment signal to the work station according to the work station status; a storage module for storing a work station correlation chart, wherein a placement signal is generated by the work station with the feeder tray being placed therein, and corresponds to a work station serial number, while the placement signal together with the corresponding work station serial number are used to establish the work station correlation chart; an input/output control module for transmitting a mounting signal to a work station corresponding to the stream controlling signal generated by the microprocessor module so as to prompt the corresponding work station to generate a mounting message to the operator, and for receiving the placement signal from the work station and searching in the work station correlation chart of the storage module for a work station serial number corresponding to the received placement signal, wherein the corresponding work station serial number is transmitted to the microprocessor module; the inquiry module is prompted to write a record indicating the feeder tray placement of the work station into the SMD correlation chart in response to the corresponding work station serial number, and searches for barcodes corresponding to the work station serial number for obtaining data of loading capacities to be transmitted to the microprocessor module; and the microprocessor module determines according to the searched work station serial number from the inquiry module if the corresponding work station is placed with feeder trays in position; if the feeder trays are placed in position, the microprocessor module generates an operational signal to the work station; or else, the microprocessor module generates a non-operational signal to the work station; a calculation module for calculating replenishment time of the feeder trays during initiating the operation of the work station according to the loading capacities received by the microprocessor module, wherein a replenishment signal is transmitted by the microprocessor module to the work station, and then the work station generates a replenishment message to the operator when the operation time of the work station approaches the replenishment time of the feeder trays during the operation of the work station; and a display module for displaying the searched work station serial number from the input/output control module corresponding to the placement signal transmitted from the work station, so as to allow an examination operator to verify and initiate the operation of the work station; the display module prompted by the microprocessor module for displaying the work station serial number and corresponding material serial numbers for the feeder trays to be replenished when the operation time of the work station approaches the replenishment time of the feeder trays, so as to allow a replenishment operator to perform the replenishment process.

In the system for controlling a surface mounting process of the invention, the storage module and the input/output control module are mounted in a single chip controlling circuit. The inquiry module, the microprocessor module, the calculation module, the display module and the printer module are installed in a computer device or a server host. Therefore, by integrating and connecting the single chip controlling circuit, the computer device or server host, the scanning device and the database server to the SMD fabrication station, the system for controlling a surface mounting process of the invention can be carried out.

The method for controlling a surface mounting process of the invention is applied to a system for controlling a surface mounting process of a surface mounting device (SMD) fabrication station, wherein an operator is informed of a work station status of the SMD fabrication station and a feeder tray in the work station is assigned and pasted with a barcode including data relating to a material serial number, a loading capacity and a quantity of the feeder tray of this type. The system for controlling a surface mounting process includes a database for storing a plurality of the barcodes and a SMD correlation chart, and a storage module for storing a work station correlation chart, which consists of a placement signal generated by the work station with the feeder tray placed therein, and a work station serial number corresponding to the placement signal.

The method for controlling a surface mounting process comprises the steps of: (1) scanning a barcode on a feeder tray via the system for controlling a surface mounting process; (2) retrieving a work station serial number via the system for controlling a surface mounting process from the database corresponding to the scanned barcode; (3) transmitting a mounting signal via the system for controlling a surface mounting process to a corresponding work station in response to the retrieved work station serial number, and prompting the work station to transmit a mounting message to the operator; (4) transmitting a placement signal via the work station to the system for controlling a surface mounting process after placing the feeder tray in the work station; (5) retrieving a work station serial number via the system for controlling a surface mounting process from the storage module corresponding to the placement signal, and writing a record of feeder tray placement into the SMD correlation chart of the database corresponding to the retrieved work station serial number, which is displayed by a display module; (6) determining via the system for controlling a surface mounting process if the work station is placed with corresponding feeder trays therein according to the SMD correlation chart stored in the database, wherein if the feeder trays are not readily placed, the work station is prompted to generate a non-operational signal, and the step (1) is repeated; if the feeder trays are placed in position, then step (7) is followed; and (7) prompting the work station to generate an operational signal via the system for controlling a surface mounting process.

The step (7) of the foregoing method for controlling a surface mounting process further comprises the steps of: (7-1) retrieving loading capacities of barcodes via the system for controlling a surface mounting process from the database corresponding to the work station serial number, and calculating replenishment time for the work station according to the retrieved loading capacities; (7-2) determining via the system for controlling a surface mounting process if operation time of the work station approaches the replenishment time thereof, wherein if the operation time is not approaching the replenishment time, the step (7-2) is repeated; or else, step (7-3) is followed; and (7-3) transmitting a replenishment signal via the system for controlling a surface mounting process to the work station to be replenished, and prompting the work station to generate a replenishment message to the operator, wherein the work station serial number and corresponding material serial numbers of the barcodes are displayed by the display module, so as to allow the operator to obtain materials for replenishment from a material replenishment area.

In the step (7-3), the system for controlling a surface mounting process establishes a list of the material serial numbers for the feeder trays to be replenished, and prompts a printer device to print the list, so as to allow a preparation operator to prepare and provide the materials for replenishment for the operator. Therefore, in the use of the foregoing method for controlling a surface mounting process, the operation is informed of replenishment for the feeder trays before the feeder trays run out of loaded materials, so that the surface mounting process can be more time-effectively performed, and productivity and profit in fabrication can be increased.

The work station of the SMD fabrication station is installed with a placement signal light, which is turned on in response to the mounting signal transmitted from the input/output control module. A plurality of signal lights are installed in the work station of the SMD fabrication station, including an operational signal light, a non-operational signal light and a replenishment signal light, so as to inform the operator of the work station status accurately in real time.

BRIEF DESCRIPTION OF THE DRAWINGS

For more complete understanding of the present invention, reference will be made to the following detailed description of preferred embodiments taken in conjunction with the accompanying drawings, in which.

DETAILED DESCRIPTION OF THE PREFERRED EMBODIMENTS

Figure 2:
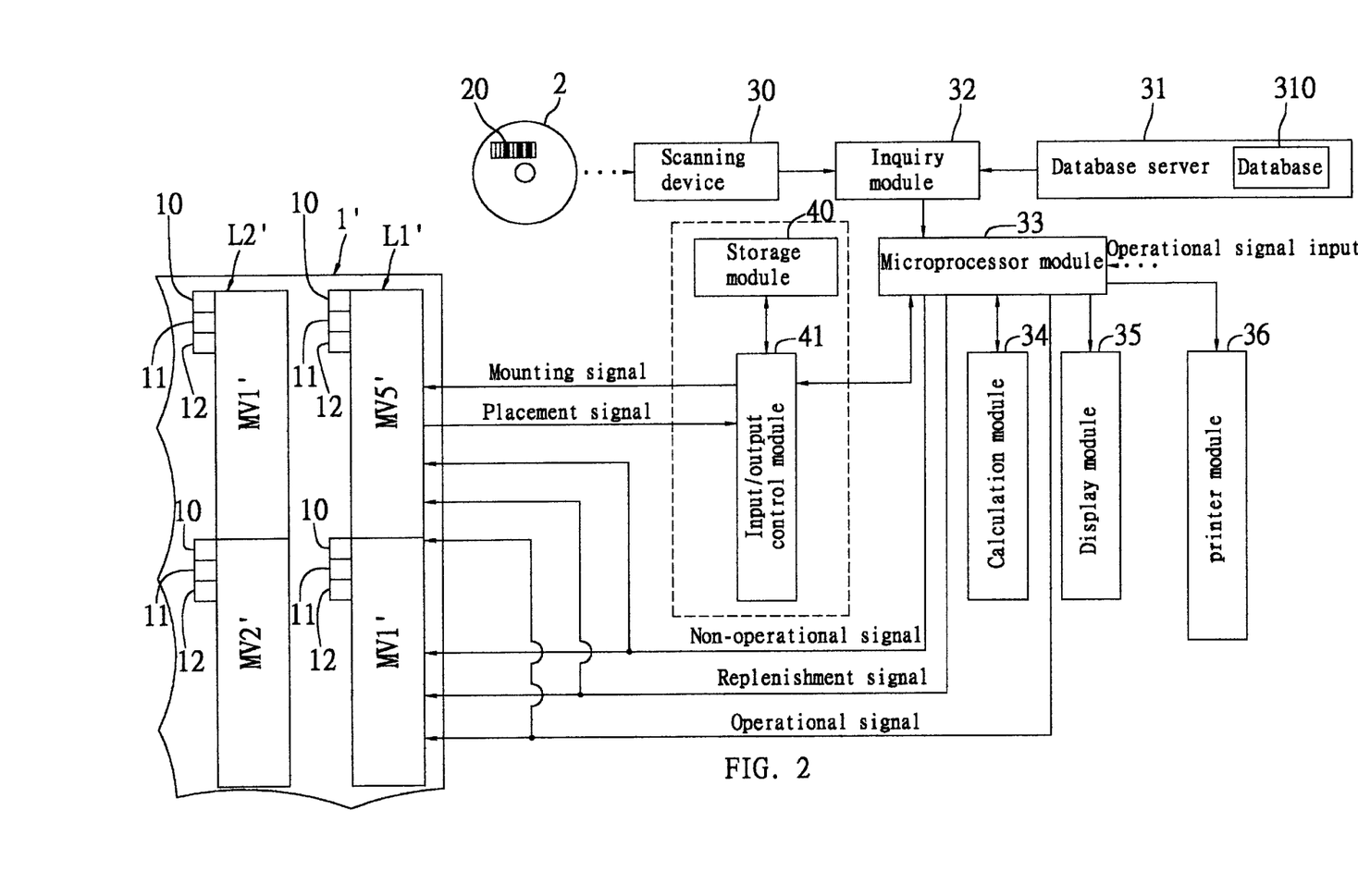
FIG. 2 is a block diagram showing system architecture of a system for controlling a surface mounting process of the invention.

Referring to FIG. 2, it illustrates system architecture of a system for controlling a surface mounting process of the invention. As shown in the drawing, the system for controlling a surface mounting process comprises a scanning device 30, a database server 31, an inquiry module 32, a microprocessor module 33, a calculation module 34, a display module 35, a printer module 36, a storage module 40, and an input/output controlling module 41. A plurality of fabrication lines (L1', L2') of a SMD fabrication station 1' are respectively integrated with the system for controlling a surface mounting process. A plurality of work stations (not shown) of each SMD (MV1', MV2'or MV5') are connected to the storage module 40 and the input/output controlling module 41 (indicated as the dotted line area), respectively. For the sake of simplicity in the drawing and description, only part of the SMDs are illustrated in the system architecture herein.

First, each feeder tray 2 is stuck with a barcode 20, which includes data relating to a material serial number, loading capacity of the feeder tray, and a quantity of this type of feeder tray. Therefore, the barcode 20 is unique for the feeder tray 2, and has its last code designed for an examination purpose, so as to eliminate the occurrence of a fake thereof The database server 31 is pre-established with a database 310 for storing a plurality of the barcodes 20 and a SMD correlation chart (not shown), wherein each of the barcodes 20 corresponds to a specific work station serial number in the SMD correlation chart. The database server 31 such as a server host is connected to the system for controlling a surface mounting process through a network, for allowing the inquiry module 32 to retrieve the stored data from the database server 31. The storage module 40 is pre-established with a work station correlation chart (not shown), wherein when a feeder tray is placed into a work station, the work station generates an placement signal corresponding to the work station serial number, and the generated placement signal together with the corresponding work station serial number are use to construct the work station correlation chart stored in the storage module 40 such as a EEPROM.

The scanning device 30 is used to scan a barcode 20 on a feeder tray 2. The inquiry module 32 searches in the SMD correlation chart stored in the database 310 for a work station serial number corresponding to the scanned barcode 20 of the feeder tray 2. The microprocessor module 33 receives the searched work station serial number from the inquiry module 32 and thus generates a corresponding stream controlling signal. It is to be understood that when a plurality of barcodes are scanned, this would prompt the inquiry module 32 to search in the database 310 for the corresponding SMD work stations from the database 310 and these information are transmitted to the microprocessor module 33. In response to this, the microprocessor module 33 generates a plurality of stream controlling signals corresponding to each of the scanned barcodes and transmits them to their respective SMD work stations as correlated by the database 310. The stream controlling signals may be transmitted through a com port.

The input/output controlling module 41 facilitates transmission of the stream controlling signal from the microprocessor module 33 to the corresponding work station, and prompt the work station to generate a mounting signal. For example, if the stream controlling signal having a programmed label tag 00010000 . . . 0, is received by the input/output controlling module 41, the bit "1" characterizes the signal corresponding to a SMD work station which is then prompted to generate a mounting signal, wherein if the work station is provided with a signal light (not shown), upon receiving the bit "1" signal, the signal light is turned on for advising an operator to place the feeder tray 2 with its scanned barcode 20 at this work station. After the feeder tray 2 is placed in position in the work station, an placement signal is generated and transmitted to the input/output controlling module 41, which then retrieves a corresponding work station serial number from the work station correlation chart stored in the storage module 40 according to the placement signal, and transmits the work station serial number to the inquiry module 32. This in turn prompts the microprocessor module 33 to generate a parameter signal in response to the work station serial number received the inquiry module 32 and then transmit the generated parameter signal to the corresponding SMD work station. Thus the status of the SMD work stations can be effectively processed by the microprocessor module 33. If the right feeder trays are in position in a corresponding SMD work station, then the microprocessor module 33 generates and transmits an operational signal to said SMD work station allowing an operator to initiate the surface mounting process. And if the right feeder trays are not in position in the corresponding SMD work station, then the micro processor module 33 generates and transmits a non-operational signal to said SMD work station, disabling the operator from initiating the fabrication process. There are several signal lights on the control panel of every SMD work station. For example, the signal lights includes but not restricted to, a non-operational signal light 10, a replenishment signal light 11, and an operational signal light 12. The operational signal light 12 will be turned on when the SMD work station receives an operational signal. The non-operational signal light 10 will be turned on when the SMD work station receives a non-operational signal. This allows a safe operation of the SMD control system.

The display module 35 is prompted by the microprocessor module 33 to display the work station serial number retrieved by the input/output controlling module 41 from the storage module 40 corresponding to the placement signal, so as to allow the operator to verify the status of the SMD work station for subsequently initiating the operation of the SMD work station.

The calculation module 34 takes the command from the microprocessor module 33. When the microprocessor module 33 receives an input signal from the operation for operation initiation, the microprocessor module 33 commands the calculation module 34 to calculate the replenishment time T for each feeder tray of every SMD work stations according to the loading capacity N of the feeder tray. The calculation module 34 is predefined with data relating to the consumption time t, the material consumption quantity n, etc required in each mounting of a SMD circuit board, and is programmed with calculation formulae. For example, the calculation module 34 calculates the replenishment time T of the feeder tray by using an equation $T=N/n*t$. The calculated replenishment time of the feeder tray is then transmitted to the microprocessor module 33. Upon reaching the replenishment time, the microprocessor module 33 generates a replenishment signal, and transmits this replenishment signal to the SMD work station; this then turns on the replenishment signal light 11 of the work station. And the microprocessor module 33 commands the display module 35 to display the work station serial number and the barcode information of the feeder tray that needs replenishment, so as to inform the operator to proceed the material replenishment for the feeder tray.

Upon reaching the replenishment time, the microprocessor module 33 commands the printer module 36 to generate and transmit a printing signal to a printer device; this would prompt the printer device to print out a list of barcodes information that reflect on the corresponding feeder trays that need replenishment. This allows the operator to replenish the feeder trays according to the list well in advance. Thus the system and the method of the invention provides an efficient and time effective surface mounting process by which the yield and the through-put are both increased. And also the fabrication cost can also be substantially reduced. The printer module 36 can employ transmission protocol such as TCP/IP (Transmission control protocol/Internet protocol), linking with a material preparation department through a network.

The foregoing storage module 40 and the input/output control module 41 may be programmed in a single chip controlling circuit (not shown), which can be installed in every SMD work station. The inquiry module 32, the microprocessor module 33, the calculation module 34, the display module 35 and the printer module 36 can be installed in a computer device or a server host. Therefore, by integrating the single chip controlling circuit, the computer device or server host, the scanning device 30 and the database server 31, and linking to the SMD work stations, a system for controlling a surface mounting process can thus be provided, in which the surface mounting process can be well controlled.

There are a plurality of signal lights installed in every SMD work station. The signal lights, such as placement signal light, operational and non-operational signal lights and the replenishment signal lights, are turned on or off during the operation of the fabrication process advising the status of each and every devices. For example, the signal lights can advise the operators of the location of feeder trays, whether a SMD is in an operational or non-operational mode and feeder tray replenishment. This enables the operators to understand the fabrication status accurately, allowing every device to be fully controlled during the operation. Therefore, the system for controlling a surface mounting process of the invention prevents problems occurring due to human errors.

In addition, in the use of the system for controlling a surface mounting process of the invention, changing a model of products in fabrication can be easily achieved. First, a new SMD correlation chart corresponding to the new product model is stored in advanced in the database 310 of the database server 31. Next, the current fabrication is interrupted, and the inquiry module 32 compares barcode information of feeder trays in operational work stations with that of the new SMD correlation chart. Then, the microprocessor module 33 transmits a replenishment signal to the work stations with different barcode information for turning on replenishment signal lights 11, and simultaneously prompts the printer module 36 to product a replenishment list to be printed out by a printer device installed in a material preparation department, so as to initiate the replenishment process. Then, an operator removes the feeder trays from the work stations with the replenishment signal lights 11 turned on, and replenishes the removed feeder trays with desired materials. Subsequently, the above mentioned processes such as barcode scanning etc are performed prior to initiating the mounting process for the new model products. Therefore, since only the feeder trays with undesired barcode information are replaced by replenishing desired materials therein, thus the new model products can be desirably fabricated in a simplified manner, with no need to alter the entire fabrication process and replace all the feeder trays.

Thus, by using the system for controlling a surface mounting process of the invention, the surface mounting process is not only substantially simplified, but also the problems due to human error can be effectively eliminated. Therefore, the production yield can be substantially increased. Because of the simplified process the operation time can be more efficiently utilized. Therefore, the overall production cost can be substantially reduced.

Figure 3:
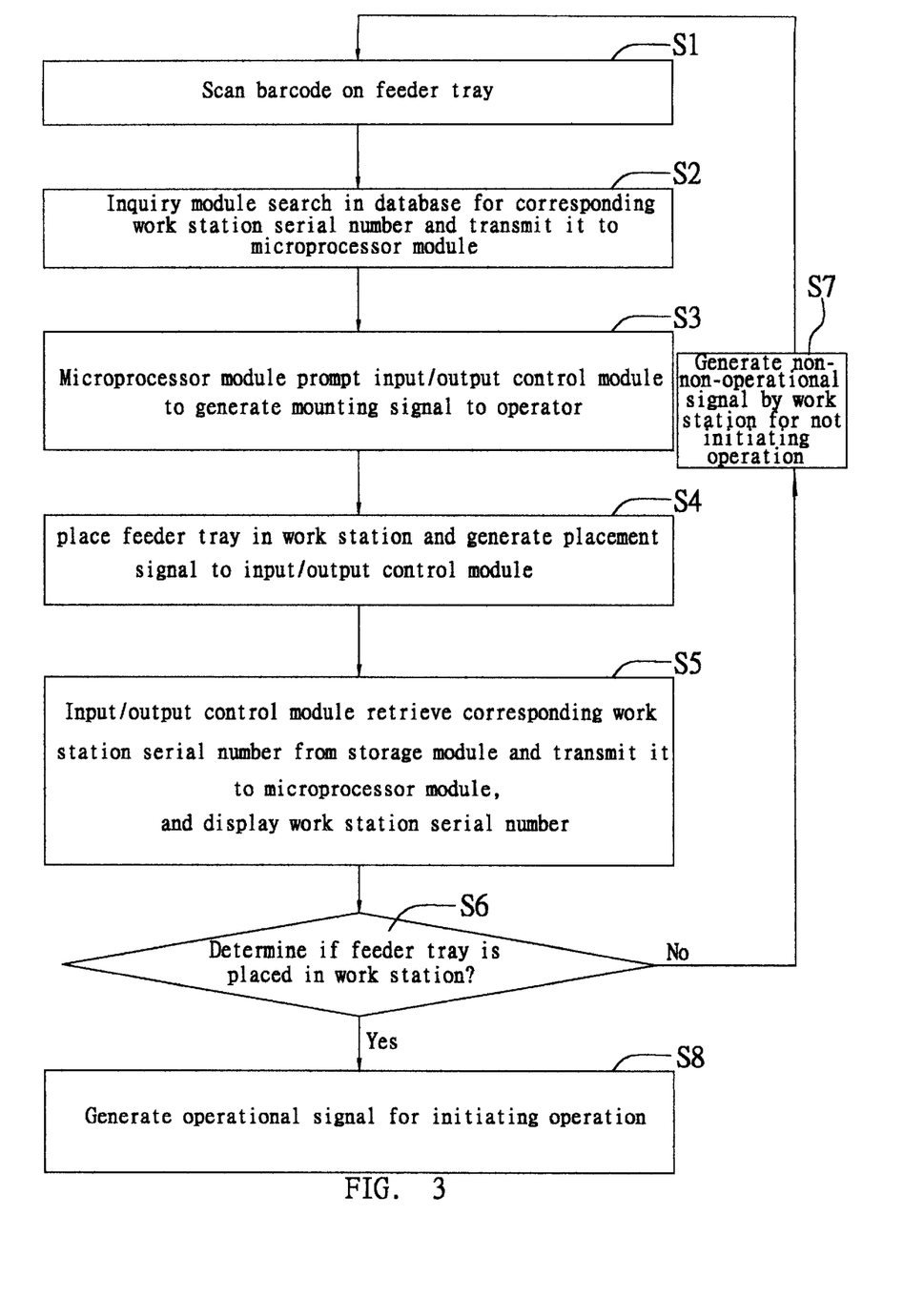
FIG. 3 is a schematic diagram depicting a method for controlling a surface mounting process of a preferred embodiment of the invention.

Referring to the FIG. 3, it illustrates a method for controlling a surface mounting process of a preferred embodiment of the invention. The following description is made with reference to FIGS. 2 and 3.

According to the method for controlling a surface mounting process of a preferred embodiment of the invention, the SMD fabrication station 1' is connected to the system for controlling a surface mounting process of the invention. Each feeder tray is stuck with a corresponding barcode including information of a material serial number and loading capacity. Then the barcodes of the feeder trays and a SMD correlation chart are stored in the database 310, and a work station correlation chart is pre-established in the storage module 40. First in step S1, an operator receives a feeder tray from a material preparation area and scans the barcode 20 on feeder tray 2 by using the scanning device 30. Thereafter, step S2 is followed.

In step S2, the inquiry module 32 searches in the database 310 for a work station serial number corresponding to the scanned barcodes 20, and transmits the searched work station serial number to the microprocessor module 33. Then, step S3 is followed.

In step S3, in response to the work station serial number transmitted from the inquiry module 32, the microprocessor module 33 prompts the input/output control module 41 to generate a mounting signal to the corresponding SMD work station, so as to turn on a placement signal light of the SMD work station for indicating the operator to place the feeder tray 2 on a rack in the SMD work station. Then, step S4 is followed.

In step S4, after placing the feeder tray 2 on the rack of the SMD work station, a placement signal is generated and transmitted to the input/output control module 41. Then, step S5 is followed.

In step S5, upon receiving the placement signal, the input/output control module 41 is prompted to retrieve a work station serial number from the storage module 40 corresponding to the placement signal, and transmits the work station serial number to the microprocessor module 33. The microprocessor module 33 commands the inquiry module 32 to retrieve a related record stored in the database 310 according to the transmitted work station serial number, and writes in the retrieved record with a message indicating the placement of the feeder tray in the SMD work station, while the work station serial number is displayed in the display module 35. Then, step S6 is followed.

In step S6, the microprocessor module 33 determines if a SMD work station to be operated has its work station serial number accompanied with a message of feeder tray placement according to the SMD correlation chart stored in the database 310. If the work station serial number is not accompanied with the placement message, then step S7 is followed; or else, step S8 is followed.

In step S7, the microprocessor module 33 transmits a non-operational signal to the SMD work station; this then turns on a non-operational signal light 10 of the SMD work station indicating non-operational status, so as to inform the operator not to initiate the surface mounting process. Then, the step S1 is returned thereto.

In step S8, the microprocessor module 33 transmits an operational signal to the SMD work station; this then turns on an operational signal light 12 of the SMD work station indicating operational status, so as to enable the operator to initiate the surface mounting process.

Figure 4:
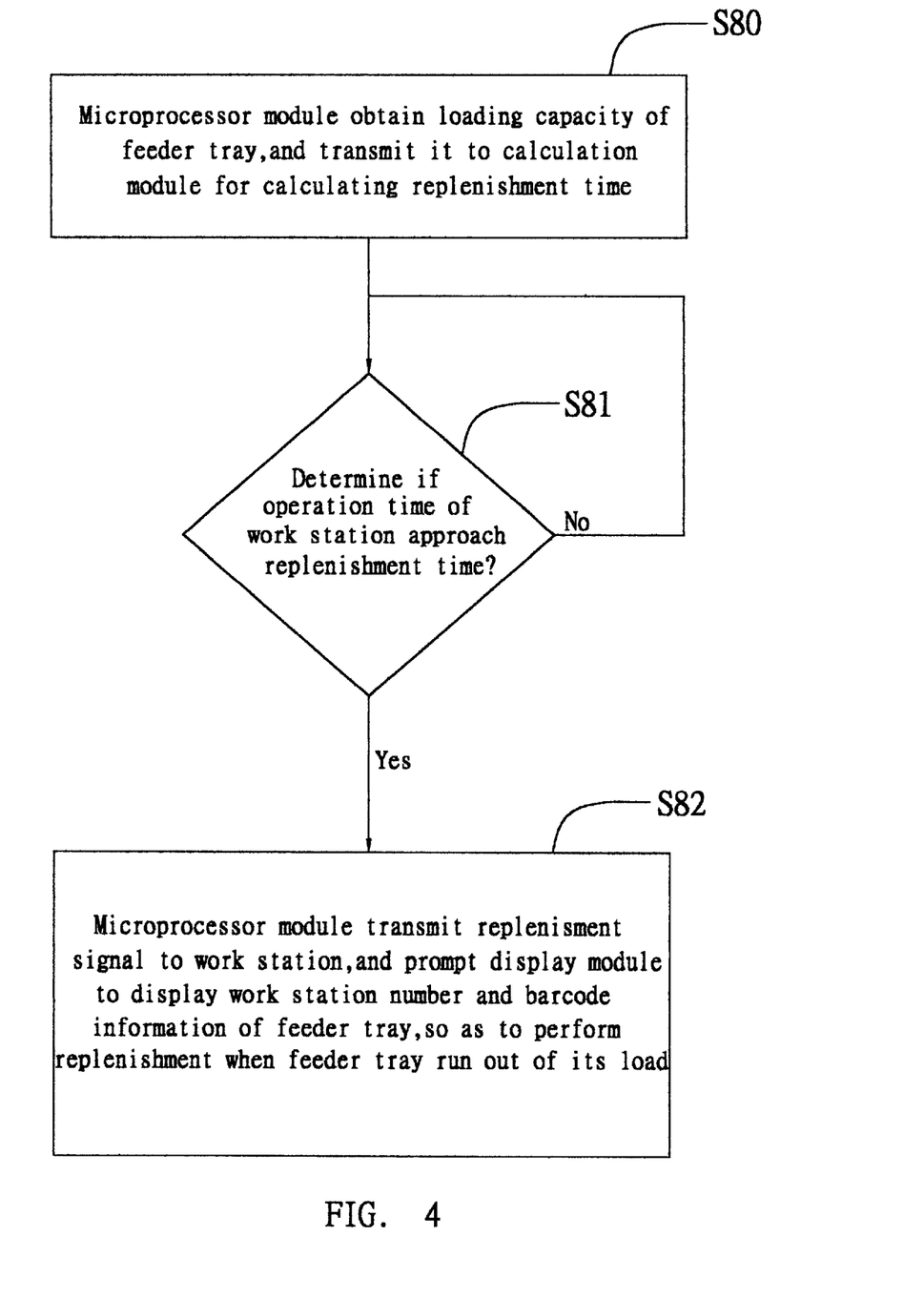
FIG. 4 is a schematic diagram showing the detailed steps performed after step S8 of FIG. 3.

FIG. 4 illustrates the detailed steps performed after step S8 of FIG. 3. As shown in the drawing, first in step S80, prior to the operation of the surface mounting process, the microprocessor module 33 transmits the loading capacity data of the barcode of the feeder tray 2 in the SMD work station to the calculation module 34, for calculating the replenishment time of the feeder tray 2. Then, step S81 is followed.

In step S81, in operation of the surface mounting process, the microprocessor module 33 determines if the operation time of the SMD work station approaches the replenishment time calculated by the calculation module 34. If the replenishment time is to be reached, then step S82 is followed; or else, the step S81 is returned thereto.

In step S82, the microprocessor module 33 transmits a replenishment signal to the SMD work station; this then turns on the replenishment signal light 11 of the SMD work station, so as to inform the operation of replenishment of the feeder tray for next operation. The display module 35 displays the SMD work station serial number and the material serial number contained in the barcode of the feeder tray that is to be replenished, allowing the operator to prepare another feeder tray loaded with replenished material, so as to replace the feeder tray that finishes its load with the newly loaded feeder tray while the operation is interrupted for replacement.

Further in step S82, during transmitting the replenishment signal to the SMD work station, the microprocessor module 33 also transmits the material serial number of the feeder tray that is to be replenished to the printer module 36, for prompting a printer device of a material preparation department to printing out a replenishment list. This allows operators of the material preparation department to prepare feeder trays loaded with replenished materials according to the list promptly and efficiently.

Therefore, in the use of the method for controlling a surface mounting process of the invention, since manual reading of identification information of feeder trays and corresponding SMD work stations in a SMD correlation chart is eliminated, thus misplacement of a feeder tray in a wrong work station can be effectively avoided. Therefore, problems due to human error can be substantially reduced or prevented from occurrence. Besides, material replenishment during fabrication can be efficiently controlled and managed. Therefore, the overall productivity and profit can be substantially increased.

Figure 5:
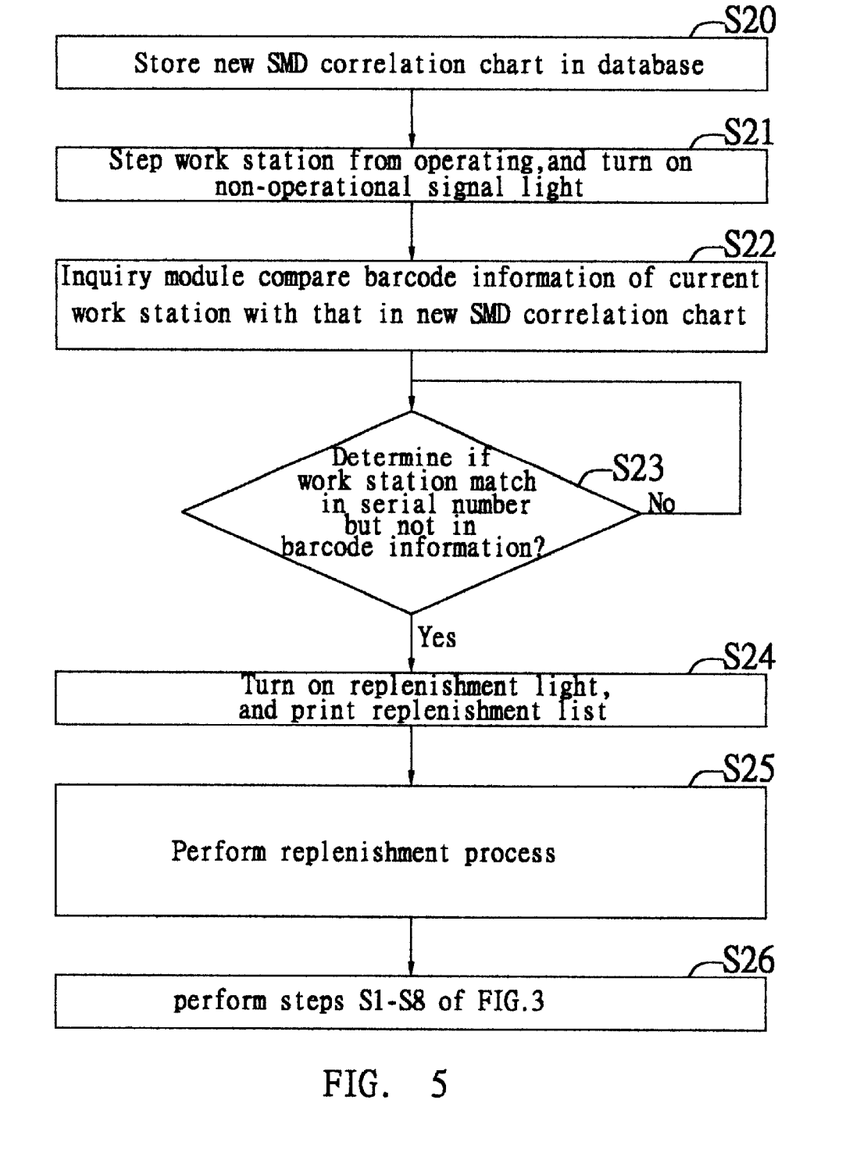
FIG. 5 is a schematic diagram depicting a method for controlling a surface mounting process of another preferred embodiment of the invention.

FIG. 5 illustrates a method for controlling a surface mounting process of another preferred embodiment of the invention. In order to fabricate a new model of products in the SMD fabrication station 1', first in step S20, the database 310 of database server 31 is refreshed with a new SMD correlation chart corresponding to the new product model to be fabricated. For example, the database server 31 is established in an intranet system. A user (e.g. an executive officer for programming the SMD correlation chart) at a terminal device can transmit the new SMD correlation chart into the database 310 for storage via linking up through a network system, so as to provide data required for operation of the surface mounting process in the SMD fabrication station 1'. Then, step S21 is followed.

In step S21, an operator stops the operation; this prompts the microprocessor module 33 to transmit a non-operational signal to all SMD work stations, for turning on non-operational signal lights 10 of the work stations. Then, step S22 is followed.

In step S22, the microprocessor module 33 commands the inquiry module 32 to compare all barcodes in the SMD work stations with those in the new SND correlation chart stored in the database 310. Then, step S23 is followed.

In step S23, the microprocessor module 33 determines according to the compared results from the inquiry module 32 if a SMD work station matches a data record in the new SMD correlation chart in work station serial number but not in barcode. If such a mismatched work station is found, then step S24 is followed; or else, the step S23 is returned thereto.

In step S24, the microprocessor module 33 sends a replenishment signal to the mismatched SMD work station with the undesired barcodes for turning on a replenishment signal light 11 of the work station, and transmits desired barcodes for replenishing the SMD work station to the printer module 36, so as to print out and send a replenishment list to a material preparation department; this then allows operators of the material preparation department to prepare feeder trays replenished with desired materials, which are ready to replace the mismatched work station with the right feeder trays. Then, step S25 is followed.

In step S25, the operator removes the mismatched feeder trays of a rack from the SMD work station, which are returned to a material preparation area, and obtains the right feeder trays. Then, step S26 is followed.

In step S26, after the right feeder trays are replaced for the mismatched feed trays, then the steps S1–S8 are performed as described in FIG. 3.

Therefore, in the use of the method and system for controlling a surface mounting device of the invention, changing the product model in fabrication can be easily and time-effectively achieved, so that the overall productivity and profit in operation of the surface mounting process can be substantially increased.

While the present invention has been described in conjunction with a specific best mode, it is to be understood that many alternatives, modifications, and variations will be apparent to those skilled in the art in light of the foregoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

What is claimed is:

1. A system for controlling a surface mounting process, for use in a surface mounting device (SMD) fabrication station, in which an operation is informed of a work station status of the SMD fabrication station, and a feeder tray in the work station is assigned and pasted with a barcode reflecting identification data for the feeder tray, so as to allow the operator to perform a surface mounting process in the SMD fabrication station; the system comprising:

a scanning device for scanning a barcode on a feeder tray;
a database server having a database for storing a plurality of the barcodes and a SMD correlation chart, wherein each of the barcodes includes data of the feeder tray relating to a material serial number, a loading capacity and a quantity of the feeder tray, and corresponds to a work station serial number in the SMD correlation chart;

an inquiry module for retrieving a one of the work station serial numbers from the SMD correlation chart corresponding to the scanned barcode from the scanning device;

a microprocessor module for receiving a retrieved work station serial number from the inquiry module, so as to generate a stream controlling signal in response to the received work station serial number, and for generating an operational or non-operational signal or a replenishment signal to a work station according to a work station status;

a storage module for storing a work station correlation chart, wherein the work station generates a placement signal corresponding to the work station serial number when the feeder tray is placed therein, and the placement signal together with the corresponding work station serial number are used to establish the work station correlation chart;

an input/output control module for transmitting a mounting signal to the work station corresponding to the stream controlling signal generated by the microprocessor module so as to prompt the corresponding work station to generate a mounting message to the operator, and for receiving the placement signal from the work station and searching in the work station correlation chart of the storage module for a work station serial number corresponding to the received placement signal, wherein the corresponding work station serial number is transmitted to the microprocessor module; the inquiry module is prompted to write a record indicating a feeder tray placement of the work station into the SMD correlation chart in response to the corresponding work station serial number, and searches for barcodes corresponding to the work station serial number for obtaining data of loading capacities to be transmitted to the microprocessor module; and the microprocessor module determines according to the searched work station serial number from the inquiry module if the corresponding work station is placed with feeder trays in position; and if the feeder trays are placed in position, the microprocessor module generates an operational signal to the work station; or else, the microprocessor module generates a non-operational signal to the work station;

a calculation module for calculating replenishment time of the feeder trays during initiating the operation of the work station according to the loading capacities received by the microprocessor module, wherein a replenishment signal is transmitted by the microprocessor module to the work station, and then the work station generates a replenishment message to the operator when the operation time of the work station approaches the replenishment time of the feeder trays during the operation of the work station; and a display module for displaying the searched work station serial number from the input/output control module corresponding to the placement signal transmitted from the work station, so as to allow an examination operator to verify and initiate the operation of the work station; the display module prompted by the microprocessor module for displaying the work station serial number and corresponding material serial numbers for the feeder trays to be replenished when the operation time of the work station approaches the replenishment time of the feeder trays, so as to allow a replenishment operator to perform the replenishment process.

2. The system of claim 1, further comprising a printer module for prompting a printer device to print a list of the material serial numbers for the feeder trays to be replenished, so as to allow a preparation operator to replenish the feeder trays with corresponding materials according to the list, and to prepare the replenished feeder trays ready to be used.

3. The system of claim 1, wherein the storage module and the input/output control module are mounted in a single chip controlling circuit.

4. The system of claim 2, wherein the inquiry module, the microprocessor module, the calculation module, the display module, the printer module, the storage module and the input/output controlling module are installed in a computer device.

5. The system of claim 4, wherein the computer device is connected to the database server through a network for retrieving the SMD correlation chart and the barcodes from the database, and is connected to a material preparation department through a network for transmitting the list established by the printer module to the material preparation department.

6. The system of claim 2, wherein the inquiry module, the microprocessor module, the calculation module, the display module, the printer module, the storage module and the input/output control module are installed in a server host.

7. The system of claim 6, wherein the server host is connected to the database server through a network for retrieving the SMD correlation chart and the barcodes from the database, and is connected to a material preparation department through a network for transmitting the list established by the printer module to the material preparation department.

8. The system of claim 1, wherein the storage module is an EEPROM.

9. The system of claim 1, wherein the work station of the SMD fabrication station is installed with a placement signal light, which is turned on in response to the mounting signal transmitted from the input/output control module.

10. The system of claim 1, wherein a plurality of signal lights are installed in the work station of the SMD fabrication station, including an operational signal light for being turned on in response to the operational signal transmitted from the microprocessor module; a non-operational signal light for being turned on in response to the non-operational signal transmitted from the microprocessor module; and a replenishment signal light for being turned on in response to the replenishment signal transmitted from the microprocessor module.

11. A method for controlling a surface mounting process, for use in a system for controlling a surface mounting process of a surface mounting device (SMD) fabrication station, in which an operator is informed of a work station status of the SMD fabrication station; a feeder tray in the work station is assigned and pasted with a barcode including data relating to a material serial number, a loading capacity and a quantity of the feeder tray; and the system for controlling a surface mounting process includes a database for storing a plurality of barcodes and a SMD correlation chart, and a storage module for storing a work station correlation chart, which consists of a placement signal generated by the work station with the feeder tray placed therein and a work station serial number corresponding to the placement signal; the method comprising the steps of:

(1) scanning a barcode on a feeder tray via the system for controlling a surface mounting process;

(2) retrieving a work station serial number via the system for controlling a surface mounting process from the database corresponding to the scanned barcode;

(3) transmitting a mounting signal via the system for controlling a surface mounting process to a corresponding work station in response to the retrieved work station serial number, and prompting the work station to transmit a mounting message to the operator;

(4) transmitting a placement signal via the work station to the system for controlling a surface mounting process after placing the feeder tray in the work station;

(5) retrieving a work station serial number via the system for controlling a surface mounting process from the storage module corresponding to the placement signal, and writing a record of feeder tray placement into the SMD correlation chart of the database corresponding to the retrieved work station serial number, which is displayed by a display module;

(6) determining via the system for controlling a surface mounting process if the work station is placed with corresponding feeder trays therein according to the SMD correlation chart stored in the database, wherein if the feeder trays are not readily placed, the work station is prompted to generate a non-operational signal, and the step (1) is repeated; if the feeder trays are placed in position, then step (7) is followed; and (7) prompting the work station to generate an operational signal via the system for controlling a surface mounting process.

12. The method of claim 11, wherein the step (7) further comprises the steps of:

(7-1) retrieving loading capacities of barcodes via the system for controlling a surface mounting process from the database corresponding to the work station serial number, and calculating replenishment time for the work station according to the retrieved loading capacities;

(7-2) determining via the system for controlling a surface mounting process if operation time of the work station approaches the replenishment time thereof, wherein if the operation time is not approaching the replenishment time, the step (7-2) is repeated; or else, step (7-3) is followed; and (7-3) transmitting a replenishment signal via the system for controlling a surface mounting process to the work station to be replenished, and prompting the work station to generate a replenishment message to the operator, wherein the work station serial number and corresponding material serial numbers of the barcodes are displayed by the display module, so as to allow the operator to obtain materials for replenishment from a material replenishment area.

13. The method of claim 12, wherein the step (7-3) further comprises the step of:

establishing a list of the material serial numbers for the feeder trays to be replenished via the system for controlling a surface mounting process, and prompting a printer device to print the list, so as to allow a preparation operator to prepare and provide the materials for replenishment for the operator.

14. The method of claim 11, wherein the storage module is an EEPROM.

15. The method of claim 11, wherein the database is installed in a server host, to which the system for controlling a surface mounting process is connected through a network for retrieving and storing data in the database.

16. The method of claim 13, wherein the printer device is connected to the system for controlling a surface mounting process through a network, for printing the list established in the system for controlling a surface mounting process to a material preparation department.

17. The method of claim 11, wherein the system for controlling a surface mounting process is installed in a computer device.

18. The method of claim 11, wherein the system for controlling a surface mounting process is installed in a server host.

19. The method of claim 11, wherein the work station of the SMD fabrication station is installed with a placement signal light, which is turned on in response to the mounting signal transmitted from the system for controlling a surface mounting process.

20. The method of claim 12, wherein a plurality of signal lights are installed in the work station of the SMD fabrication station, including an operational signal light for being turned on in response to the operational signal transmitted from the system for controlling a surface mounting process; a non-operational signal light for being turned on in response to the non-operational signal transmitted from the system for controlling a surface mounting process; and a replenishment signal light for being turned on in response to the replenishment signal transmitted from the system for controlling a surface mounting process.

* * * * *